United States Patent [19]

King et al.

[11] Patent Number: 5,174,886
[45] Date of Patent: Dec. 29, 1992

[54] HIGH-THROW ACID COPPER PLATING USING INERT ELECTROLYTE

[75] Inventors: Randal D. King; Eda R. Montgomery, both of Wilmington, Del.

[73] Assignee: McGean-Rohco, Inc., Cleveland, Ohio

[21] Appl. No.: 659,584

[22] Filed: Feb. 22, 1991

[51] Int. Cl.$^5$ .............................................. C25D 3/38
[52] U.S. Cl. ................................... 205/125; 205/291; 205/296; 205/920
[58] Field of Search ................ 205/291, 296, 920, 125

[56] References Cited

U.S. PATENT DOCUMENTS

| | | | |
|---|---|---|---|
| 4,036,711 | 7/1977 | Kardos et al. | 205/298 |
| 4,469,569 | 9/1984 | Tomaszewski et al. | 205/296 |
| 4,975,159 | 12/1990 | Dahms | 205/125 |
| 5,051,154 | 9/1991 | Bernards et al. | 205/125 |

OTHER PUBLICATIONS

Chemical Abstracts-86:130008v.

Primary Examiner—John Niebling
Assistant Examiner—Brian M. Bolam
Attorney, Agent, or Firm—William P. Hauser; James A. Lucas

[57] ABSTRACT

Improved through-hole plating of printed circuit boards, wherein the ratio of the printed circuit board thickness to the diameter of at least one through hole is greater than 3 to 1, is achieved by a high-throw acid copper plating bath of this invention. The high-throw acid copper plating bath comprises an aqeuous solution of (A) copper sulfate, (B) sulfuric acid, (C) chloride ion, e.g., hydrochloric acid, (D) a carrier, (E) a brightener, and (F) an alkali metal salt; wherein the plating bath has a pH of not greater than about 1, the concentration of the hydrochloric acid is from about $6.0 \times 10^{-4}$ to about $1.8 \times 10^{-3}$ moles/liter, and the mole ratio of copper sulfate:sulfuric acid is not greater than about 1:25. Unlike previous high-throw acid copper plating baths, the bath of this invention contains an alkali metal salt. The use of the alkali metal salt makes it possible to maintain a lower acid concentration resulting in easier maintenance and more consistent plating. In addition this high throw process makes it possible to obtain in a substantially shorter time, plated circuits and through-holes with an acceptably high aspect ratio.

13 Claims, No Drawings

HIGH-THROW ACID COPPER PLATING USING INERT ELECTROLYTE

BACKGROUND OF THE INVENTION

This invention relates to the electrodeposition of copper from aqueous acidic baths. More particularly this invention relates to a high-throw aqueous acidic bath for the electrodeposition of copper containing additives to produce printed circuit boards having plated through-holes.

A large number of agents have been described in the art for use in electroplating baths alone or in combination to improve the quality of the electrodeposit in terms of brightness, surface smoothness, hardening, leveling and to increase the lower limiting current density of deposition. The use of such agents in aqueous, acidic, copper plating baths for the preparation of printed circuits is described in Chapter 7 of the "Printed Circuits Handbook", Second Edition, 1979, McGraw-Hill Book Company, edited by Clyde F. Coombs, Jr., and in particular Sections 18 and 19. In Section 18, Coombs indicates that additives to acid copper sulfate plating baths can be effective in grain refinement, leveling, and hardening and as a brightener or a means of increasing the current density range. The term "leveled" denotes a copper deposit whose surface is smoother than its substrate. The term "bright" indicates that the formed electrodeposit is characterized by having a highly reflective surface gloss over most of its surface. Generally leveling and brightness vary with the current density at the cathode, all other factors such as copper salt concentration, pH, type of acid, temperature etc., being equal. As the current density decreases, brightness of the electrodeposit tends to decrease often diminishing to a haze. The strength of leveling also varies with current density. Coombs indicates that such additives include glue, peptone, recorcinol, thiourea, molasses, gum arabic as well as proprietary compositions.

A variety of brightening and leveling additives are disclosed in U.S. Pat. Nos. 3,502,551; 4,376,685 and 4,555,315 and the patents cited therein.

As a result of current trends in printed circuit fabrication, i.e., use of surface mount technology, multilayer printed circuit boards are becoming thicker, circuit density is becoming greater and hole aspect ratios are likewise becoming larger. Hole aspect ratio is the ratio of the thickness of a printed circuit board to the diameter of the through hole therein. In a publication entitled "Electroplating High Aspect Ratio Through Holes in Thick Printed Circuit Boards" (Metal Finishing, vol 68, pages 50-54, 1990), Fisher et al. reported on difficulties associated with the plating process and efforts to optimize the acid copper bath and they make recommendations for printed through hole plating processes, equipment, and controls to enable successful plating of high aspect ratio through holes, e.g., boards 5.8 mm thick with an aspect ratio of 18:1. In their discussion of the electrochemistry for plating circuit boards with through holes, "throwing power" is defined as the ratio of the hole center copper deposit thickness to its thickness on the surface of the board and indicate that this ratio should be greater than 0.67:1 for plating high aspect ratio holes in printed circuit boards. Plating baths involved in such electrochemistry, are generally known in the industry as "high-throw" plating baths. Typical high-throw copper plating baths are highly acidic, e.g., a pH of about 0, and contain substantially less copper ion concentrations compared to normal acid, copper electroplating baths. To achieve high throwing power, current densities of less than 1.1 A/dm$^2$ typically are required.

The high acid concentrations used in commercially available high throw processes make it difficult to consistently produce bright deposits. Existing processes also require plating to occur at very low current densities in order to get acceptable throwing power.

There is a need which is not met by present high-throw technology to increase the consistency of performance and throughput of printed circuit boards by plating at higher current densities without sacrificing throwing power.

SUMMARY OF THE INVENTION

Improved printed circuit through-hole plating is achieved by a high-throw acid copper plating bath for plating a printed circuit board containing through-holes, wherein the ratio of the printed circuit board thickness to the diameter of at least one through hole is greater than 3 to 1, the plating bath comprising an aqueous solution of (A) copper sulfate,
(B) sulfuric acid,
(C) chloride ion,
(D) a carrier,
(E) a brightener, and
(F) an alkali metal salt;

wherein the plating bath has a pH of not greater than about 2, a concentration of the chloride ion is from about $6.0 \times 10^{-4}$ to about $1.8 \times 10^{-3}$ moles/liter, and a mole ratio of copper sulfate to sulfuric acid is not greater than about 1 to 25.

DETAILED DESCRIPTION OF THE INVENTION

The improved high-throw acid copper plating bath of this invention is particularly useful for plating a printed circuit board containing through-holes, wherein the ratio of the printed circuit board thickness to the diameter of at least one of the through holes is greater than 3 to 1. The improved high-throw acid copper plating bath of this invention is characterized in that it contains an alkali metal salt and it has a pH of not greater than about 2. In particular the high-throw acid copper plating bath of this invention comprises an aqueous solution of (A) copper sulfate, (B) sulfuric acid, (C) chloride ion, (D) a carrier, (E) a brightener, and (F) an alkali metal salt; wherein the plating bath has a pH of not greater than about 2, the concentration of the chloride ion typically as hydrochloric acid, is from about $6.0 \times 10^{-4}$ to about $1.8 \times 10^{-3}$ moles/liter, and the mole ratio of copper sulfate:sulfuric acid is not greater than about 1:25. By the use of the plating bath of this invention much higher plating current densities may be used without adversely affecting the quality of the plated copper. Such increased current densities allows shorter plating times with the concomitant larger through-put of plated printed circuit boards in a commercial operation.

The plating baths of this invention contain copper sulfate and sulfuric acid and have a pH of 2 or less and preferably a pH of about 0. The mole ratio of copper sulfate to sulfuric acid may vary substantially since the copper concentration continues to climb as anodes dissolve during the plating process. Typically the mole ratio will be from about 1:14 to 1:25. Preferably, the ratio is not more than about 1:20 and more preferably from 1:11 to 1:20.

Unlike previous high-throw acid copper plating baths, the bath of this invention contains an alkali metal salt. The use of the alkali metal salt makes it possible to maintain a lower acid concentration resulting in easier maintenance and more consistent plating. In addition this high throw process makes it possible to obtain in a substantially shorter time, plated circuits and through-holes with an acceptable high aspect ratio. Aspect ratio is the ratio of the circuit board thickness to the diameter of the through hole. An acceptably high aspect ratio typically is 5:1 or greater. The alkali metal may be lithium, sodium, potassium or mixtures thereof. Particularly useful is the lithium salt. The alkali metal salt may be a sulfate, perchlorate, phosphate or the like or mixtures thereof. Particularly useful is the alkali metal salt of the working acid, i.e., sulfate. The alkali metal salt is present in the high-throw acid copper plating bath of this invention at concentrations of at least about 0.1 moles/liter of the bath solution but may be present at concentrations ranging up to the solubility limit of the particular alkali metal salt in the plating bath.

The high-throw acid copper plating baths of this invention contains from about $6.0 \times 10^{-4}$ to about $1.8 \times 10^{-3}$ moles of chloride ion per liter of the plating bath solution. While any source of chloride ion may be used, hydrochloric acid is preferred. As with other high-throw acid copper plating baths, the baths of the present invention contains a controlled amount of chloride ion in the form of hydrochloric acid which is theorized to interact with the brightener to produce bright, ductile copper deposits.

The high-throw acid copper plating baths of this invention contain a conventional carrier component. A carrier component typically is an organic compound which functions in the plating bath to act as a surface wetting agent. Examples of typical carrier components are disclosed in U.S. Pat. Nos. 3,770,598; 3,743,584 and 4,419,192. While the choice of a specific carrier is not critical, provided it is compatible with acid conditions of the high-throw bath, preferred carriers for the plating baths of this invention include polyalkylene glycols such as polyethylene glycol, polypropylene glycol, and mixtures thereof. Typically useful polyalkylene glycols have molecular weights between several thousands to hundreds of thousands but preferred molecular weight is between about 5,000 and 20,000. The carrier typically is present in the plating bath at concentrations ranging from about 0.15 to about 0.5 grams per liter of plating bath solution. Preferred concentrations for the plating baths of this invention range from about 0.2 to about 0.4 grams per liter.

The high-throw acid copper plating baths of this invention contain a conventional brightening additive and may contain conventional leveling agent. In the instance when uniform plated copper thickness is needed in the barrel(s) of a through-hole(s), a leveling agent is preferably omitted from the plating bath. The choice of brightening or leveling additive is not critical to the performance of the plating baths of this invention and may be chosen from the variety of brightening and leveling additives disclosed in U.S. Pat. Nos. 3,502,551; 3,778,357; 3,956,084; 4,376,685 and 4,555,315. Also commercial brighteners such as contained in copperPRO ® 200, 210 and 250 and levelers such as contained in copperPRO ® 200 and 220 may be used. Preferred brighteners include 1-sodium-3-mercaptopropane-1-sulfonate; sulfoalkyl sulfide compounds disclosed in U.S. Pat. No. 3,956,084; polysulfides; thiazolidinethiones; phosphonium halides disclosed in U.S. Pat. No. 3,778,357; the peroxide oxidation product of a dialkylamino-thioxomethyl-thioalkanesulfonic acid and the like. Preferred levelers include phenazonium compounds disclosed in U.S. Pat. No. 3,956,084; N-heteroaromatic ring containing polymers; alkylated polyalkyleneimenes as disclosed in U.S. Pat. No. 4,376,685; quaternized, acrylic, polymeric amines as disclosed in U.S. patent application Ser. No. 07/558,347 filed Jul. 26 1990; polyvinyl carbamates; pyrrolidone; imidazole; and the like. Typical concentrations of the brightener range from about 0.05 to about 0.4 mg/L, and typical concentrations of the leveler range from about 0.05 to about 0.5 mg/L.

This invention also relates to a process for copper plating a printed circuit board containing through-holes, wherein the ratio of the printed circuit board thickness to the diameter of at least one through hole is greater than 3 to 1, comprising:

(I) immersing the printed circuit board in a plating bath which comprises an aqueous solution of
  (A) copper sulfate,
  (B) sulfuric acid,
  (C) chloride ion,
  (D) a carrier,
  (E) a brightener, and
  (F) an alkali metal salt; wherein the plating bath has a pH of 2 or less, the concentration of the chloride ion is from about $6.0 \times 10^{-4}$ to about $1.8 \times 10^{-3}$ moles/liter, and the mole ratio of copper sulfate:sulfuric acid is not greater than about 1:25, and (II) plating copper on the through-holes and the surface of the printed circuit board at a current density of about 0.4 amperes per square decimeter or greater.

Current densities of conventional acid high-throw plating baths typically range from about 0.4 to about 1 ampere per square decimeter. In the acid high-throw plating process of this invention, current densities well in excess of 0.4 amperes per square decimeter may be used without degradation of circuit plating characteristics, i.e., reduction of the throwing power. Preferably, the current density in the process of this invention is about 0.8 ampere per square decimeter or greater, and still more preferably between about 1 and 2.2 amperes per square decimeter.

The throwing power of a particular plating bath may be determined using conventional Haring cell measurements. The Haring cell is a rectangular box with two planar cathodes located at the ends of the box at unequal distances from a planar anode located off-center between the cathodes. The Haring cell is filled with plating solution and a current is applied across the cell. The cathodes are weighed before and after plating with the difference being the plated weights. In the measurement, two standard-size, copper-clad laminate coupons are plated in the test plating bath in a Haring cell a standard current density, temperature, and time. The far and near coupons (cathodes) were set at specified distances away from the anode, e.g., 20 cm and 4 cm respectively. The weight of plated copper is determined for both coupons and the ratio of the plated weight of the far coupon divided by the near is used to compare the throwing power of different test plating solutions.

The improved high-throw acid copper plating bath an plating process of this invention will now be further described in the following examples.

EXAMPLE 1

Two 5.1 cm × 7.6 cm single sided 1.6 mm copper clad laminate coupons were plated in the following baths at: 0.4 amps, 25° C., for 10 minutes in a Haring Cell as described supra and a pH of about 0. The far and near coupons (cathodes) were 19.0 cm and 3.8 cm away from the anode respectively. The weight of plated copper was determined for both coupons. The ratio of the plated weight of the far coupon divided by the near provides a method for comparing the throwing power of different plating solutions.

| Component | Concentration g/L | Plated Copper Ratio Far/Near × 100 |
|---|---|---|
| Normal Acid Concentration Plating Bath | | |
| $CuSO_4.5H_2O$ | 35 | |
| $H_2SO_4$ | 200 | 66 |
| $CuSO_4.5H_2O$ | 35 | |
| $H_2SO_4$ | 200 | |
| $Na_2SO_4$ | 150 | 91 |
| High Acid Concentration Plating Bath | | |
| $CuSO_4.5H_2O$ | 50 | |
| $H_2SO_4$ | 333 | 67 |
| $CuSO_4.5H_2O$ | 50 | |
| $H_2SO_4$ | 333 | |
| $Na_2SO_4$ | 200 | 89 |

The throwing power of these plating solutions improves with the addition of sodium sulfate.

EXAMPLE 2

The increased throwing power was demonstrated using alternate electrolytes, and the same procedure as in Example 1 with the following results.

| Component | Concentration g/L | Plated Copper Ratio Far/Near × 100 |
|---|---|---|
| Normal Acid Concentration Plating Bath | | |
| $CuSO_4.5H_2O$ | 35 | |
| $H_2SO_4$ | 200 | 66 |
| $CuSO_4.5H_2O$ | 35 | |
| $H_2SO_4$ | 200 | |
| $Li_2SO_4$ | 150 | 93 |
| High Acid Concentration Plating Bath | | |
| $CuSO_4.5H_2O$ | 50 | |
| $H_2SO_4$ | 333 | 67 |
| $CuSO_4.5H_2O$ | 50 | |
| $H_2SO_4$ | 333 | |
| $NaClO_4$ | 200 | 80 |

The throwing power of these plating solutions improves with the addition of the named electrolytes.

EXAMPLE 3

The ratio of the copper thickness plated in through holes divided by the thickness on the surface of multilayer boards provides a different method for comparing the throwing power of plating solutions. MultiIayer boards (2.39 mm) were plated at 1.4 A/dm² and 25° C. for 110 minutes in a standard air cell*, using the plating solutions given in the following table.
*Plating cell containing: two anodes equal distance from the cathode, air-bubblers at the bottom of the cell, and a mechanical agitator which moves the cathode

| Component | Concentration g/L | Thickness Ratio Hole/Surface |
|---|---|---|
| Board: 2.39 mm thick and 0.36 mm hole (aspect ratio 6.7:1) | | |
| Normal Acid Concentration Plating Bath Without Leveler | | |
| $CuSO_4.5H_2O$ | 35 | |
| $H_2SO_4$ | 200 | |
| Chloride | 0.030 | |
| Polyethylene glycol (M.W. 8000) | 0.20 | |
| Brightener** | $1.3 \times 10^{-4}$ | 0.71 |
| $CuSO_4.5H_2O$ | 35 | |
| $H_2SO_4$ | 200 | |
| Chloride | 0.030 | |
| Polyethylene glycol (M.W. 8000) | 0.20 | |
| Brightener** | $1.3 \times 10^{-4}$ | |
| $Na_2SO_4$ | 200 | 0.97 |
| Normal Acid Concentration Plating Bath With Leveler | | |
| $CuSO_4.5H_2O$ | 35 | |
| $H_2SO_4$ | 200 | |
| Chloride | 0.030 | |
| Polyethylene glycol (M.W. 8000) | 0.20 | |
| Brightener** | $1.3 \times 10^{-4}$ | |
| Leveler*** (copperPRO ® 220) | 2.5 mL/L | 0.83 |
| $CuSO_4.5H_2O$ | 35 | |
| $H_2SO_4$ | 200 | |
| Chloride | 0.030 | |
| Polyethylene glycol (M.W. 8000) | 0.20 | |
| Brightener** | $1.3 \times 10^{-4}$ | |
| Leveler*** (copperPRO ® 220) | 2.5 mL/L | |
| $Na_2SO_4$ | 200 | 1.00 |
| Normal Acid Concentration Plating Bath With Leveler and 2.2 A/dm² | | |
| $CuSO_4.5H_2O$ | 48 | |
| $H_2SO_4$ | 200 | |
| Chloride | 0.035 | |
| Polyethylene glycol (M.W. 8000) | 0.240 | |
| Brightener** | $1.8 \times 10^{-4}$ | |
| Leveler*** (copperPRO ® 220) | 2.5 mL/L | 0.75 |
| $CuSO_4.5H_2O$ | 48 | |
| $H_2SO_4$ | 200 | |
| Chloride | 0.035 | |
| Polyethylene glycol (M.W. 8000) | 0.240 | |
| Brightener** | $1.8 \times 10^{-4}$ | |
| Leveler*** (copperPRO ® 220) | 2.0 mL/L | |
| $Na_2SO_4$ | 200 | 1.92 |

**N,N-dimethylamino-thioxomethyl-thiopropanesulfonate, sodium salt
***copperPRO ® 220 is a plating chemicals product of E. I. du Pont de Nemours and Company, Wilmington, DE, and contains 0.0555 g/L leveler, and 13.75 g/L polyethylene glycol (M.W. 8000).

What is claimed is:

1. A high-throw acid copper plating bath for plating a printed circuit board containing through-holes, wherein a ratio of a printed circuit board thickness to a diameter of at least one through hole is greater than 3 to 1, the plating bath comprising an aqueous solution of:
   (A) copper sulfate,
   (B) sulfuric acid,
   (C) chloride ion,
   (D) a carrier,
   (E) a brightener, and
   (F) an alkali metal salt; wherein the plating bath has a pH of not greater than about 2, a concentration of the chloride ion is from about $6.0 \times 10^{-4}$ to about $1.8 \times 10^{-3}$ moles/liter, and a mole ratio of copper sulfate to sulfuric acid is not greater than about 1 to 25; and wherein the concentration of the alkali metal salt is at least about 0.1 moles/liter.

2. The high-throw acid copper plating bath of claim 1, wherein the plating bath has a pH not greater than about 1.

3. The high-throw acid copper plating bath of claim 1, wherein the alkali metal is lithium, sodium, potassium or mixtures thereof.

4. The high-throw acid copper plating bath of claim 1, wherein the alkali metal salt is a sulfate, perchlorate, phosphate, or mixtures thereof.

5. The high-throw acid copper plating bath of claim 1, wherein the concentration of the alkali metal salt is from about 0.1 moles/liter to the solubility limit of the alkali metal salt in the plating bath.

6. The high-throw acid copper plating bath of claim 1, wherein the carrier is polyalkylene glycol.

7. The high-throw acid copper plating bath of claim 6, wherein the polyalkylene glycol is polyethylene glycol.

8. The high-throw acid copper plating bath of claim 1 wherein the chloride ion is derived from hydrochloric acid.

9. The high-throw acid copper plating bath of claim 1, wherein the brightener is a compound taken from the group consisting of 1-sodium-3-mercaptopropane-1-sulfonate; sulfoalkyl sulfide compounds; polysulfides; thiazolidinethiones; phosphonium halides; the peroxide oxidation product of a dialkylamino-thioxomethyl-thioalkanesulfonic acid; and mixtures thereof.

10. The high-throw acid copper plating bath of claim 1, wherein the plating bath further comprises: (G) a leveler.

11. The high-throw acid copper plating bath of claim 10, wherein the leveler is a compound taken from the group consisting of phenazonium compounds; N-heteroaromatic ring containing polymers; alkylated polyalkyleneimenes; quaternized, acrylic, polymeric amines; polyvinyl carbamates; pyrrolidone; imidazole; and mixtures thereof.

12. A process for copper plating a printed circuit board containing through-holes, wherein a ratio of a printed circuit board thickness to a diameter of at least one through hole is greater than 3 to 1, comprising:
(I) immersing the printed circuit board in a plating bath which comprises an aqueous solution of:
  (A) copper sulfate,
  (B) sulfuric acid,
  (C) chloride ion,
  (D) a carrier,
  (E) a brightener, and
  (F) an alkali metal salt; wherein the plating bath has a pH of not greater than 2, a concentration of the chloride ion is between from about $6.0 \times 10^{-4}$ and about $1.8 \times 10^{-3}$ moles/liter, and a mole ratio of copper sulfate to sulfuric acid is not greater than about 1 to 25; and wherein the concentration of the alkali metal salt is at least 0.1 moles/liter, and
(II) plating copper on the through-holes and the surface of the printed circuit board at a current density of at least about 0.4 ampere per square decimeter.

13. The process of claim 12 wherein the current density is at least 0.8 ampere per square decimeter.

* * * * *